US012709703B2

(12) United States Patent
Sharratt et al.

(10) Patent No.: US 12,709,703 B2
(45) Date of Patent: Aug. 18, 2026

(54) COMPOSITION

(71) Applicant: Mexichem Fluor S.A. de C.V., San Luis Potosi (MX)

(72) Inventors: Andrew Sharratt, Runcorn (GB); Gary Lloyd, Runcorn (GB); Robert Low, Runcorn (GB)

(73) Assignee: MEXICHEM FLUOR S.A. DE. C.V., San Luis Potosi (MX)

( * ) Notice: Subject to any disclaimer, the term of this patent is extended or adjusted under 35 U.S.C. 154(b) by 598 days.

(21) Appl. No.: 18/044,825

(22) PCT Filed: Sep. 9, 2021

(86) PCT No.: PCT/GB2021/052333
§ 371 (c)(1),
(2) Date: Mar. 10, 2023

(87) PCT Pub. No.: WO2022/058713
PCT Pub. Date: Mar. 24, 2022

(65) Prior Publication Data

US 2023/0340312 A1 Oct. 26, 2023

(30) Foreign Application Priority Data

Sep. 17, 2020 (GB) ..................................... 2014635

(51) Int. Cl.
*C09K 5/04* (2006.01)
*G06F 1/20* (2006.01)
*H05K 7/20* (2006.01)

(52) U.S. Cl.
CPC ........ *C09K 5/045* (2013.01); *C09K 2205/112* (2013.01); *C09K 2205/22* (2013.01); *C09K 2205/32* (2013.01); *G06F 1/20* (2013.01); *G06F 2200/201* (2013.01); *H05K 7/20763* (2013.01); *H05K 7/208* (2013.01); *H05K 7/20881* (2013.01); *H05K 7/20927* (2013.01); *H05K 7/20936* (2013.01)

(58) Field of Classification Search
CPC .............. H01L 23/44; H01M 10/6567; H01M 10/6569; C09K 5/045; C09K 5/10; C09K 2205/112; C09K 2205/22; C09K 2205/32; H05K 7/20763; H05K 7/20927; H05K 7/20881; H05K 7/208; H05K 7/20936; Y02E 60/10; G06F 1/20; G06F 2200/201
USPC ........................................................... 252/71
See application file for complete search history.

(56) References Cited

U.S. PATENT DOCUMENTS

2008/0283793 A1 11/2008 Minor et al.
2010/0328891 A1 12/2010 Campbell et al.
2011/0076572 A1 3/2011 Amine et al.
2017/0256368 A1 9/2017 Raman et al.
2020/0093025 A1 3/2020 Enright et al.
2021/0079281 A1* 3/2021 Jiao .................. H01M 10/0525
2023/0361346 A1 11/2023 Sharratt et al.

FOREIGN PATENT DOCUMENTS

CN 1910255 A 2/2007
CN 1910256 A 2/2007
CN 1957054 A 5/2007
CN 101166804 A 4/2008
CN 103354297 A 10/2013
DE 10 2016 010 928 A1 3/2017
EP 1 085 591 A1 3/2001
EP 2 579 378 A1 4/2013
EP 2 750 238 A1 7/2014
EP 2 876 723 A1 5/2015
EP 3741824 A1 11/2020
JP 2006-049037 A 2/2006
JP 2015094497 A 5/2015
JP 2019-046792 A 3/2019
JP 2019-507503 A 3/2019
TW 251318 B 7/1995
WO WO 2005/008819 A2 1/2005
WO WO 2006/17533 A2 2/2006
WO WO 2011/149072 A1 12/2011
(Continued)

OTHER PUBLICATIONS

International Search Report for corresponding International application No. PCT/GB2021/052333 mailed Oct. 12, 2021, 4 pgs.
Written Opinion of the International Searching Authority for corresponding International application No. PCT/GB2021/052333 mailed Oct. 12, 2021, 7 pgs.
Taiwanese language Office Action issued in Taiwanese Application No. 110134406 dated Feb. 4, 2025, with English translation (11 pages).
Chinese-language Office Action issued in Chinese Application No. 202180063964.9 dated Jul. 5, 2025, with English translation (30 pages).
(Continued)

*Primary Examiner* — Jessica Whiteley
(74) *Attorney, Agent, or Firm* — Crowell & Moring LLP

(57) ABSTRACT

A coolant for cooling an electrical/electronic element by direct immersion cooling, comprising a partially fluorinated ether with the structure (of compound 1) wherein $R^1$, $R^2$, $R^3$, $R^4$ are independently selected from the group comprising H, F, Cl, Br, I, $CF_3$, alkyl, fluoroalkyl, haloalkyl, and R5 is independently selected from the group $CF_3$, alkyl, fluoroalkyl, perfluoroalkyl, haloalkyl perfluorohaloalkyl.

(1)

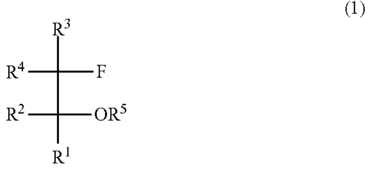

32 Claims, 3 Drawing Sheets

(56) References Cited

FOREIGN PATENT DOCUMENTS

| | | | | |
|---|---|---|---|---|
| WO | WO 2014/013858 A1 | | 1/2014 | |
| WO | WO 2017/151497 A1 | | 9/2017 | |
| WO | WO-2019140871 A1 | * | 7/2019 | .......... H01M 10/613 |

OTHER PUBLICATIONS

Japanese-language Office Action issued in Japanese Application No. 2023-517261 dated Jul. 24, 2025, with English translation (9 pages).
Search Report in corresponding Great Britain Application No. GB2014635.3, dated Feb. 25, 2021 (20 pages).
International Search Report for International application No. PCT/GB2021/052334, mailed Dec. 21, 2021 (4 pages).
Japanese-language Office Action issued in Japanese Application No. 2023-517260 dated Jul. 28, 2025, with English translation (16 pages).
Search Report in Great Britain Application No. 2014633.8, dated Feb. 26, 2021 (22 pages).
Written Opinion of the International Searching Authority for International application No. PCT/GB2021/052334, mailed Dec. 21, 2021 (5 pages).

* cited by examiner

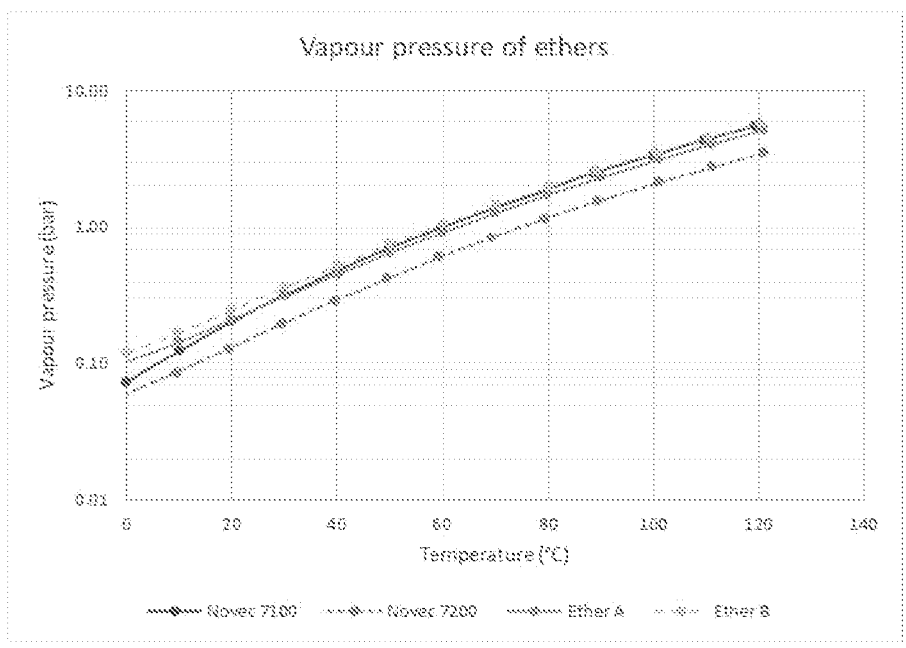
Figure 1: vapour pressure of ethers

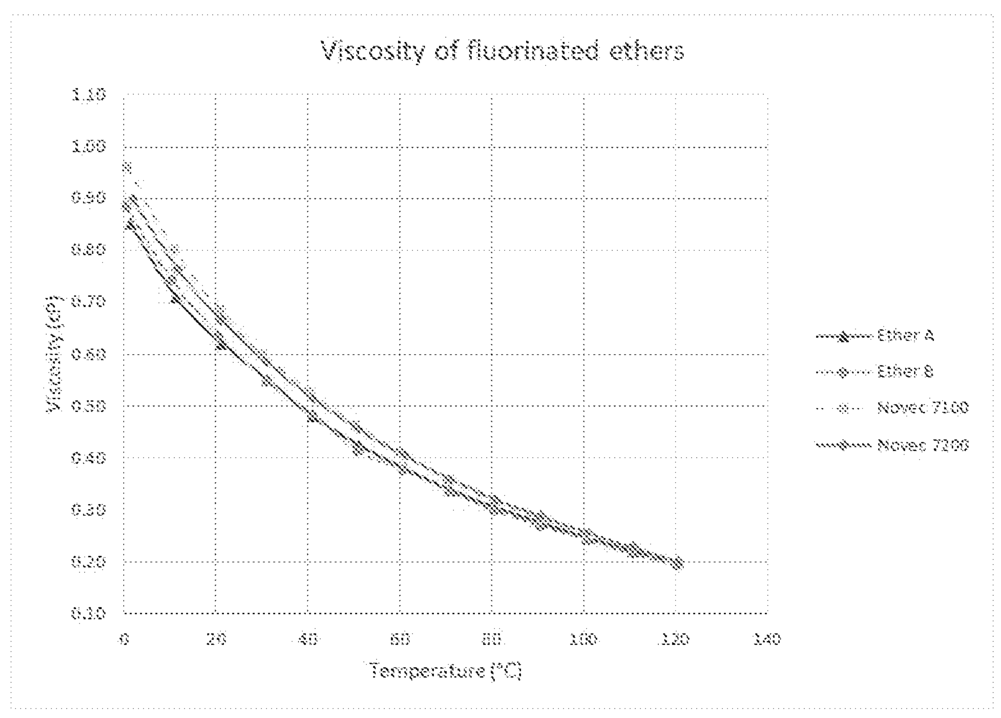
Figure 2: vapour pressure of ethers

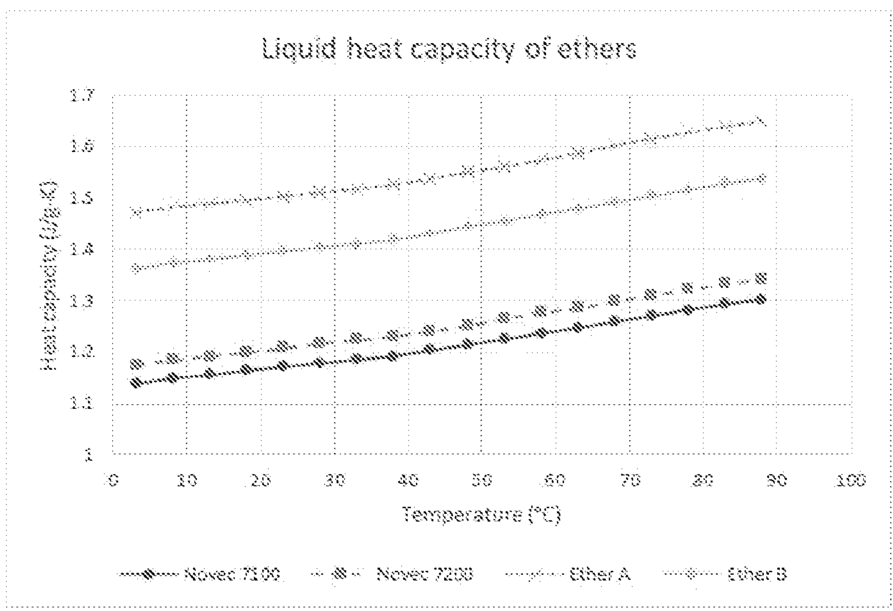
Figure 3: experimental heat capacities of ethers

COMPOSITION

CROSS-REFERENCE TO RELATED APPLICATIONS

This application is the U.S. National Stage application of PCT application no. PCT/GB2021/052333, filed on Sep. 9, 2021, titled COMPOSITION, designating the United States, which claims priority to Great Britain application no. 2014635.3, filed on Sep. 17, 2020, the contents of which are each incorporated herein by reference in their entirety.

FIELD OF INVENTION

The present invention relates to a coolant for cooling an electrical/electronic element by direct immersion cooling, comprising a partially fluorinated ether.

BACKGROUND

The listing or a discussion of a prior-published document or any background in the specification should not necessarily be taken as an acknowledgement that a document or background is part of the state of the art or is common general knowledge.

There are a number of issues associated with large scale computing installations in connection with the efficient use of power therewith. Typically, these computing installations have a high power density. The issues include the requirement for specialist buildings to provide a temperature controlled environment. Also the practicalities associated with the power density of the installed equipment has been found to affect the size of such buildings or conversely to be limited by the available size of the building. These factors have been negatively influential in determining (limiting) the performance of computing installations Typically conventional air cooling systems are used for cooling computing installations, such as data centres. Unfortunately, the use of air as a cooling medium provides not only for poor heat transfer rates but also requires specific flow regimes, that can necessitate certain building design. It has been observed that, in a data centre, approximately 45 percent of the entire power of the data centre is spent for cooling. Thus, there is a great demand for reducing the consumption power by improving cooling consumption efficiency. There is also a demand for an improved cooling medium.

Also in recent years there is an ever increasing shift away from conventional fossil fuel powered cars and other vehicles towards vehicles powered at least partially and, in some cases, completely by electrical power. These "electric" vehicles typically comprise an electric storage system (such as battery) and an electrical drivetrain element (comprising power electronics and one or more electric motors). Normally these elements requires thermal management in use, such that they operate most efficiently, without being damaged.

Indeed there is a drive to ever quicker charging of the battery of these vehicles, without causing damage; such quick charging has been limited so far by the inability of traditional battery cooling and/or heating systems to provide sufficient thermal management. Some of these thermal management systems have had to be based on aqueous/aqueous derived systems (such as water or water/glycol) systems because of their high heat capacity. However, clearly such aqueous compositions are incompatible with electrical components (due to their high dielectric constant) meaning than intricate and inefficient separation and heat management interfaces are required.

BRIEF DESCRIPTION OF THE DRAWINGS

FIG. 1 is a graph of the vapor pressures of ethers.

FIG. 2 is a graph of the vapor pressures of ethers.

FIG. 3 is a graph of heat capacities of ethers.

DETAILED DESCRIPTION

It is an object of the present invention to addresses the above deficiencies.

According to a first aspect of the invention there is provided a coolant for cooling an electrical/electronic element by direct immersion cooling, comprising a partially fluorinated ether with the structure (of compound 1)

(1)

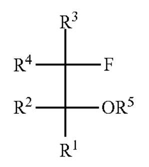

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl.

According to a second aspect of the invention there is provided an insulator medium for an electrical electronic element, by at least partial direct immersion of the an electrical/electronic element, comprising a partially fluorinated ether with the structure (of compound 1)

(1)

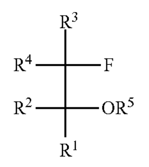

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl.

Preferably the composition of the first and second aspect is substantially water free. By the use of the term water free it is intended that the composition is entirely water free or has a low water content of less than about 1000 ppm, more preferably less than 500 ppm, more preferably less than 300 ppm, more preferably less than 200 ppm and most preferably less than 100 ppm water.

The composition of the first and second aspect may comprise a desiccant. Alternatively the element, with which the composition is used may have a desiccant incorporated therein or adapted to work in conjunction therewith. As an example the electrical element may be configured or adapted to incorporate an optionally replaceable cartridge comprising a desiccant.

In the composition of the first and second aspect preferably $R^5$ is methyl; preferably $R^1$ is $CF_3$ and $R^2$ to $R^4$ are all H; alternatively $R^1$ is $CF_3$, $R^2$ is H, one of $R^3$ and $R^4$ is F, and one of $R^3$ and $R^4$ is H.

The composition of the first and second aspect preferably additionally comprise a non-flammable fluorinated (partially or per) ether and/or a non-flammable fluorinated (partially or per) ketone. Suitable fluorinated ethers include partially or per-fluorinated butyl-alkyl ethers, such as $C_4F_9OCH_3$ (1,1,1,2,2,3,3,4,4-nonafluoro-4-methoxy-butane); commercially available as HFE7100 under the trade name "Novec 7100" and $C_4F_9OC_2H_5$ (1,1,1,2,2,3,3,4,4-nonafluoro-4-ethoxy-butane); commercially available as HFE7200 under the trade name "Novec 7200". A preferred example of a fluorinated (partially or per) ketone 1,1,1,2,2,4,5,5,5-nonafluoro-4-(trifluoromethyl)-3-pentanone and the structural formula $CF_3CF_2C(=O)CF(CF_3)^2$, commercially available under the trade name "Novec 1230". Such fluids are commercially available from 3M.

Here it has been found that with the incorporation of such fluorinated ethers or ketones the flammability of the composition may be greatly reduced or rendered non-flammable. Further the partly fluorinated ethers of the composition have been found to have higher specific heat capacity and lower liquid viscosity than fluorinated (partially or per) ether and/or a fluorinated (partially or per) ketones (such as either Novec 7100 or 7200). This means that mixtures comprising the partly fluorinated ethers of the invention with a fluorinated (partially or per) ether and/or a fluorinated (partially or per) ketone have been found to exhibit superior performance as heat transfer fluids. The higher heat capacity allows for reduction of mass flow rate required to achieve a given cooling duty. This reduced mass flow rate combined with an (additionally observed) lower viscosity improves the local rate of heat transfer; and for flow systems also reduces the energy required to overcome pressure drop in pumping coolant around the cooling circuit.

Preferably the composition of the first and second aspect comprises from 1 to 99 wt % of the partially fluorinated ether (of compound 1) and from 1 to 99 wt % of a fluorinated (partially or per) ether and/or a fluorinated (partially or per) ketone. More preferably the composition comprises from 10 to 80 wt % of the partially fluorinated ether (of compound 1) and from 90 to 20% wt % of a fluorinated (partially or per) ether and/or a fluorinated (partially or per) ketone. More preferably the composition comprises from 20 to 70 wt % of the partially fluorinated ether (of compound 1) and from 80 to 30% wt % of a fluorinated (partially or per) ether and/or a fluorinated (partially or per) ketone. More preferably the composition comprises from 30 to 60 wt % of the partially fluorinated ether (of compound 1) and from 70 to 40% wt % of a fluorinated (partially or per) ether and/or a fluorinated (partially or per) ketone. More preferably the composition comprises from 40 to 50 wt % of the partially fluorinated ether (of compound 1) and from 60 to 50% wt % of a fluorinated (partially or per) ether and/or a fluorinated (partially or per) ketone.

Advantageously the composition comprises sufficient fluorinated (partially or per) ether and/or a fluorinated (partially or per) ketone to render the composition non-flammable.

Particularly preferred compositions of the invention are binary mixtures of either 1,1,1,3-tetrafluoro-2-methoxypropane ("Ether A") or 1,1,1,3,3-pentafluoro-2-methoxypropane ("Ether B") (both of compound 1) and $C_4F_9OCH_3$ (1,1,1,2,2,3,3,4,4-nonafluoro-4-methoxy-butane). Both Ether A and Ether B form azeotropic or near-azeotropic mixtures with $C_4F_9OCH_3$ at temperatures in the anticipated operating range for immersive coolants. This means that the composition of the mixture will not change (or change to an insignificant extent) even if used as a two-phase coolant undergoing vaporisation and condensation processes.

A preferred example of an electrical/electronic element comprises a medium or high voltage electrical transmission element, such as those used for/in the supply of electricity from power stations to domestic/commercial users. Thus, according to a third aspect of the invention there is provided an insulator medium for a medium or high voltage electrical transmission element by at least partial immersion of the element, comprising a partially fluorinated ether with the structure (of compound 1)

(1)

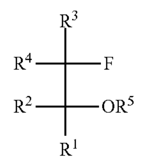

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl.

The elements of the first and second aspects of the invention shall be taken to apply mutatis mutandis to the third aspect of the invention.

The composition of the third aspect of the invention has been found to be beneficial in that it displays properties of high dielectric strength and thus serves as an effective insulator. The dielectric strength has been found to be in excess of 1 kV, more preferably in excess of 5 kV, more preferably in excess of 10 kV, more preferably in excess of 15 kV, such as 18 kV or even 20 kV; when measured across a 0.1" (2.5 mm) gap. It has also been found to serve as a capable preventative agent against electrical arcing (thus acting as an arc-quenching agent)

The composition is further advantageous in that it is non-toxic and inert. In comparison to typical compositions that have previously been used for this purpose (sulphur hexafluoride, $SF_6$) the composition of the third aspect of the invention has a low global warming potential (GWP). $SF_6$ historically used, has a GWP of 23,500.

Preferred examples of medium or high voltage electrical transmission element include MV/HV transformers, circuit breakers, switchgear and gas insulated lines.

A further preferred example of an electrical/electronic element comprises an element used in an electric vehicle. Thus, according to a fourth aspect of the invention there is provided a coolant for cooling an element of an electric vehicle by direct immersion cooling, comprising a partially fluorinated ether with the structure with the structure (of compound 1)

(1)

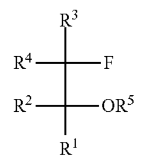

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl.

The elements of the first and second aspects of the invention shall be taken to apply mutatis mutandis to the fourth aspect of the invention.

Unless otherwise stated, it is to be understood that the term "electric vehicle" as used herein refers to both purely electric vehicles as well as vehicles which use electricity as one of several means of propulsion, such as hybrid vehicles.

Preferred examples of element of an electric vehicle include batteries, electrical conductors (including components of any charging/discharging system(s)) and motor(s)/gearbox(es). Further examples of elements of an electric vehicle include power electronics plus components of any (external) charging system, such as an external power regulator and charging cable(s).

The composition of the fourth aspect of the invention wherein the composition is an azeotropic or near-azeotropic mixture has been found to be beneficial in that it provides a highly efficient non-conductive heat transfer fluid.

The composition of the fourth aspect of the invention is therefore preferably employed as a "dual-phase" system. This means (in the context of this invention) that the coolant is allowed to boil before being re-directed back to the element being cooled (optionally via an external cooling means such as a radiator). (In environments with a high ambient temperature (e.g. such as over 40° C.) a compressor may be needed). The composition of the fourth aspect of the invention is therefore advantageous in that this fixed boiling point provides a fixed upper operating temperature of the element of an electric vehicle being cooled.

The composition of the fourth aspect of the invention has been found to be particularly advantageous in that it aids maximizing of charging and discharging of battery element of electric vehicles and long term battery performance.

It also permits high power transfer through drivetrain components such as motors and gearboxes.

By enabling electric vehicle battery operation at optimum temperatures issues of Li plating (observed at low temperatures), and SEI layer formation (observed at high temperatures) have been diminished.

Optionally the heat transferred by the composition of the fourth aspect of the invention may be used as space-heating, e.g. to heat the inside of the electric vehicle. Additionally and/or conversely heat may be transferred by the composition of the fourth aspect of the invention from another source (i.e. to provide a heating mode). This can ensure that the temperature of the battery (or other element used in an electric vehicle) is not allowed to be below its optimum temperature range, such as in cooler conditions. This could occur via heat recovery from another source, electrical heating or via a heat pump.

A further preferred example of an electrical/electronic element comprises a computer hardware element. Thus, according to a fifth aspect of the invention there is provided a coolant for cooling a computer hardware element by direct immersion cooling, comprising a partially fluorinated ether with the structure (of compound 1)

(1)

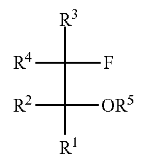

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl.

The elements of the first and second aspects of the invention shall be taken to apply mutatis mutandis to the fifth aspect of the invention.

Preferred examples of computer hardware elements include servers at data centres.

The composition of the fifth aspect of the invention wherein the composition is an azeotropic or near-azeotropic mixture has been found to be beneficial in that it provides a highly efficient non-conductive heat transfer fluid.

The composition of the fifth aspect of the invention can be employed either as a single phase coolant (in which no vaporisation of the coolant occurs during heat transfer) but it is also advantageously employed as a "dual-phase" system. This means (in the context of this invention) that the coolant is allowed to boil before being re-directed back to the element being cooled (optionally via and external cooling means such as a radiator. The composition of the fifth aspect of the invention is therefore advantageous in that this fixed boiling point provides a fixed upper operating temperature of the computer hardware element being cooled.

The composition of the fifth aspect of the invention has been found to be particularly advantageous in that it aids cooling of computer hardware elements. The previously observed serious disadvantages of air cooling computer hardware elements including restrictive building design and the requirement for expensive and inefficient air conditioning systems can be obviated. The elimination of these inefficient air conditioning systems (and their noisy cooling fans) means that noise issues cause by fan usage can be eliminated.

Additionally as the composition of the fifth aspect of the invention allows for enhanced cooling efficacy this has the knock-on effect of increased computing equipment power density; this is beneficial in leading to leading to decreased space requirements.

Preferably the composition of the third, fourth and fifth aspect is substantially water free. By the use of the term water free it is intended that the composition is entirely water free or has a low water content of less than about 1000 ppm, more preferably less than 500 ppm, more preferably less than 300 ppm, more preferably less than 200 ppm and most preferably less than 100 ppm water.

The composition of the third, fourth and fifth aspect may comprise a desiccant. Alternatively the element, with which the composition is used may have a desiccant incorporated therein or adapted to work in conjunction therewith. As an example the element may be configured or adapted to incorporate an optionally replaceable cartridge comprising a desiccant.

EXPERIMENTAL SECTION

The physical properties of 1,1,1,3-tetrafluoro-2-methoxypropane ("Ether A"), 1,1,1,3,3-pentafluoro-2-methoxypropane ("Ether B"), $C_4F_9OCH_3$ (Novec 7100) and $C_4F_9OC_2H_5$ (Novec 7200) were determined by a series of experiments.

Experiment 1: Determination of Vapour Pressure

The liquid to be measured was stored in a cylindrical test cell determine the vapour pressure. The liquid was stirred during the measurement to obtain a quick adjustment of the phase equilibrium in the measuring cell using a magnetic stirrer. The temperature of the test cell was adjusted in a thermostat bath. The temperature in the test cell was measured with a calibrated resistance thermometer (maximum error 0.05 K).

For the pressure measurement a pressure transmitter from Keller (Serie 35 X HTC 30 bar absolute, error<±0.5% full-scale error≙0.15 bar), was attached to the test cell. The Keller Sensor is temperature compensated up to 300° C. 150 ml of test liquid was filled into the test cell and degassed by vacuum. The vapour pressure was recorded in the range 0-120° C. for each fluid. These data were then used to determine the normal (atmospheric pressure) boiling point for each fluid. The normal boiling points found (in ° C.) were:

| Ether A | Ether B | Novec 7100 | Novec 7200 |
|---|---|---|---|
| 63.0 | 58.9 | 59.8 | 75.5 |

The experimental vapour pressures are shown in FIG. 1. It was found that the vapour pressure curve of Novec 7100 crossed those of both Ether A and Ether B, indicating that binary mixtures of those ethers with Novec 7100 would form azeotropic compositions.

Experiment 2: Determination of Liquid Viscosity

The dynamic viscosity was measured using a Cambridge Viscosity Flow-Through Viscometer at static conditions. The measurement procedure is described in ASTM D 7483-13a1 in detail. The viscometer was calibrated with calibration liquids, which are traceable to national standards of viscosity (DKD or NIST calibration, respectively). The temperature was measured with a maximum deviation of 0.15 K. The maximum deviation of the viscosity was 1% Full Scale or maximal 5% of the measured value, depending on which value is lower.

Results for the four fluids are shown in FIG. 2. It is evident that both Ether A and Ether B have lower viscosities than either Novec 7100 or Novec 7200.

Experiment 3: Determination of Liquid Heat Capacity

The measurement of the specific heat capacity was done with a differential scanning calorimeter μDSC VII by Setaram. During the procedure, the heat applied to a reference and to the sample was measured over a range of temperatures. The samples were placed into a vessel and heated in steps of 5 K with 0.2 K/min rate of temperature rise. At each 5 K temperature level the temperature was kept constant for half an hour to reach thermal equilibrium. A second empty vessel was heated in parallel in the DSC with the same sequences to compensate thermal influence by the vessel itself. The difference of the thermal absorption behavior of the two empty vessels was measured for every 5 K with the same procedure and subtracted automatically. After the measurement and the calibration run, the specific heat capacity was calculated as function of the temperature with the measured heat and the weight of the sample. The measurement was checked with fluids of well-known specific heat capacity. The uncertainty of the specific heat capacity measurement was below 3%. The results are shown in FIG. 3.

It is evident that Ether A and Ether B both have significantly higher heat capacity than either Novec 7100 or Novec 7200.

Experiment 4: Determination of Liquid Density

The liquid density of each of Ether A, Ether B, Novec 7100 and Novec 7200 was measured at room temperature using a calibrated measuring cylinder and microbalance. The densities were found to be (in $kg/m^3$):

| Ether A | Ether B | Novec 7100 | Novec 7200 |
|---|---|---|---|
| 1270 | 1340 | 1510 | 1440 |

The above combination of properties show that Ether A and Ether B would both require a lower mass and volume flow rate of coolant to remove a constant amount of heat from a heat-generating electronic component or battery pack. This in turn means that pressure drop through the cooling circuit would be lower if these fluids were used as single-phase pumped coolants, resulting in reduced pumping power requirements compared to the Novec fluids. Combination of Ether A with a Novec fluid will therefore improve its ability to remove heat when the resultant liquid is used as a single-phase coolant.

Example 6: Estimation of Azeotropic Mixture Formation

The vapour pressure data determined in Experiment 1 were used to construct a thermodynamic model based on the Peng-Robinson equation of state to allow estimation of the behaviour of binary mixtures of Ether A and Ether B with the Novec fluids. The critical point parameters required were estimated using the method of Joback as described in the reference text "The Properties of Gases and Liquids", 5*th* edition editors B E Poling, J M Prausnitz, J P O'Connell (pub. McGraw-Hill 2000). The Mathias Copeman temperature function as described in Mathias P. M., Copeman T. W., "Extension of the Peng-Robinson Equation of State to Complex Mixtures: Evaluation of the Various Forms of the Local Composition Concept", Fluid Phase Equilib., 13, 91-108, 1983. was used to ensure that the model could accurately represent the vapour pressure of each fluid over the range in which experimental data were available.

Use of this model confirmed the formation of binary minimum-boiling azeotropes of Novec 7100 with Ether A and Ether B in the temperature range 20-100° C., which coincides with typical operating temperature ranges for immersive coolants.

The invention claimed is:

1. A coolant for cooling an electrical/electronic element by direct immersion cooling, comprising a partially fluorinated ether with the structure (of compound 1)

(1)

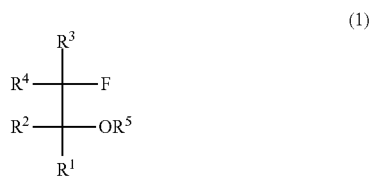

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl; and wherein the coolant additionally comprises a non-flammable fluorinated ether and/or a non-flammable fluorinated ketone.

2. The coolant according to claim 1, wherein the coolant is water free.

3. The coolant according to claim 1, wherein $R^5$ is methyl, $R^1$ is $CF_3$ and $R^2$ to $R^4$ are all H; or wherein $R^5$ is methyl, $R^1$ is $CF_3$, $R^2$ is H, one of $R^3$ and $R^4$ is F, and one of $R^3$ and $R^4$ is H.

4. The coolant according to claim 1 wherein the coolant comprises from 1 to 99 wt % of the partially fluorinated ether of compound 1 and from 1 to 99 wt % of a non-flammable fluorinated ether and/or a non-flammable fluorinated ketone.

5. A coolant for cooling a high voltage electrical transmission element by direct immersion cooling, comprising a partially fluorinated ether with the structure (of compound 1)

(1)

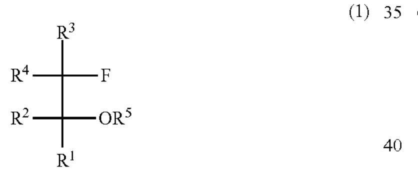

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl; and wherein the coolant additionally comprises a non-flammable fluorinated ether and/or a non-flammable fluorinated ketone.

6. The coolant according to claim 5, wherein the coolant is water free.

7. The coolant according to claim 5, wherein the high voltage electrical transmission element comprises a MV/HV transformer, a circuit breaker, switchgear.

8. The coolant according to claim 5, wherein $R^5$ is methyl, $R^1$ is $CF_3$ and $R^2$ to $R^4$ are all H; or wherein $R^5$ is methyl, $R^1$ is $CF_3$, $R^2$ is H, one of $R^3$ and $R^4$ is F, and one of $R^3$ and $R^4$ is H.

9. The coolant according to claim 5 wherein the coolant comprises from 1 to 99 wt % of the partially fluorinated ether of compound 1 and from 1 to 99 wt % of a non-flammable fluorinated ether and/or a non-flammable fluorinated ketone.

10. A coolant for cooling an electric vehicle element by direct immersion cooling, comprising a partially fluorinated ether with the structure (of compound 1)

(1)

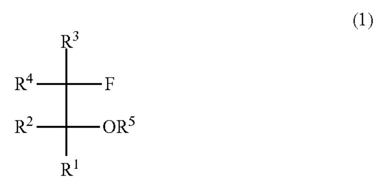

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl; and wherein the coolant additionally comprises a non-flammable fluorinated ether and/or a non-flammable fluorinated ketone.

11. The coolant according to claim 10, wherein the coolant is water free.

12. The coolant according to claim 10, wherein the electric vehicle element comprises a battery, an electrical conductor (including components of any charging/discharging system(s)), a motor and/or a gearbox.

13. The coolant according to claim 10, wherein $R^5$ is methyl, $R^1$ is $CF_3$ and $R^2$ to $R^4$ are all H; or wherein $R^5$ is methyl, and preferably $R^1$ is $CF_3$, $R^2$ is H, one of $R^3$ and $R^4$ is F, and one of $R^3$ and $R^4$ is H.

14. The coolant according to claim 10 wherein the coolant comprises from 1 to 99 wt % of the partially fluorinated ether of compound 1 and from 1 to 99 wt % of a non-flammable fluorinated ether and/or a non-flammable fluorinated ketone.

15. A coolant for cooling a computer hardware element by direct immersion cooling, comprising a partially fluorinated ether with the structure (of compound 1)

(1)

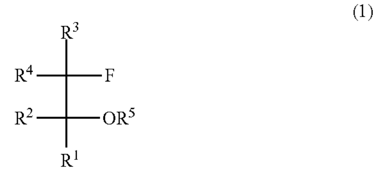

wherein $R^1$, $R^2$, $R^3$, $R^4$ are independently selected from the group comprising H, F, Cl, Br, I, $CF_3$, alkyl, fluoroalkyl, haloalkyl and $R^5$ is independently selected from the group $CF_3$, alkyl, fluoroalkyl, perfluoroalkyl, haloalkyl perfluorohaloalkyl; and wherein the coolant additionally comprises a non-flammable fluorinated ether and/or a non-flammable fluorinated ketone.

16. The coolant according to claim 15, wherein the coolant is water free.

17. The coolant according to claim 15, wherein the computer hardware element comprises a server at a data centre.

18. The coolant according to claim 15, wherein $R^5$ is methyl, $R^1$ is $CF_3$ and $R^2$ to $R^4$ are all H; or wherein $R^5$ is methyl, $R^1$ is $CF_3$, $R^2$ is H, one of $R^3$ and $R^4$ is F, and one of $R^3$ and $R^4$ is H.

19. The coolant according to claim 15 wherein the coolant comprises from 1 to 99 wt % of the partially fluorinated ether of compound 1 and from 1 to 99 wt % of a non-flammable fluorinated ether and/or a non-flammable fluorinated ketone.

20. The coolant according to claim 1, which form an azeotropic or near-azeotropic mixture.

21. The coolant according to claim 20, which wherein the partially fluorinated ether comprises 1,1,1,3-tetrafluoro-2-methoxypropane or 1,1,1,3,3-pentafluoro-2-methoxypropane and the additional non-flammable fluorinated ether comprises $C_4F_9OCH_3$.

22. The coolant according to claim 21, forming an azeotropic or near-azeotropic mixture comprising 10 to 90 wt % $C_4F_9OCH_3$ and 10 to 90 wt % 1,1,1,3-tetrafluoro-2-methoxypropane.

23. The coolant according to claim 21, forming an azeotropic or near-azeotropic mixture comprising 5 to 70 wt % $C_4F_9OCH_3$ and 30 to 95 wt % 1,1,1,3,3-pentafluoro-2-methoxypropane.

24. The coolant according to claim 21, forming an azeotropic or near-azeotropic mixture comprising 20 to 80 wt % $C_4F_9OCH_3$ and 20 to 80 wt % 1,1,1,3-tetrafluoro-2-methoxypropane.

25. The coolant according to claim 21, forming an azeotropic or near-azeotropic mixture comprising 30 to 70 wt % $C_4F_9OCH_3$ and 30 to 70 wt % 1,1,1,3-tetrafluoro-2-methoxypropane.

26. The coolant according to claim 21, forming an azeotropic or near-azeotropic mixture comprising 30 to 60 wt % $C_4F_9OCH_3$ and 40 to 70 wt % 1,1,1,3-tetrafluoro-2-methoxypropane.

27. The coolant according to claim 21, forming an azeotropic or near-azeotropic mixture comprising 10 to 65 wt % $C_4F_9OCH_3$ and 35 to 90 wt % 1,1,1,3,3-pentafluoro-2-methoxypropane.

28. The coolant according to claim 21, forming an azeotropic or near-azeotropic mixture comprising 15 to 60 wt % $C_4F_9OCH_3$ and 40 to 85 wt % 1,1,1,3,3-pentafluoro-2-methoxypropane.

29. The coolant according to claim 1, wherein $R^5$ is methyl.

30. The coolant according to claim 5, wherein $R^5$ is methyl.

31. The coolant according to claim 10, wherein $R^5$ is methyl.

32. The coolant according to claim 15, wherein $R^5$ is methyl.

* * * * *